(12) United States Patent
Nakama

(10) Patent No.: US 10,886,926 B1
(45) Date of Patent: Jan. 5, 2021

(54) SYNCHRONIZATION METHOD AND CONTROLLER

(71) Applicant: FANUC CORPORATION, Yamanashi (JP)

(72) Inventor: Tomomasa Nakama, Yamanashi (JP)

(73) Assignee: FANUC CORPORATION, Yamanashi (JP)

( * ) Notice: Subject to any disclaimer, the term of this patent is extended or adjusted under 35 U.S.C. 154(b) by 0 days.

(21) Appl. No.: 16/939,545

(22) Filed: Jul. 27, 2020

(30) Foreign Application Priority Data

Aug. 7, 2019 (JP) .................................. 2019-145463

(51) Int. Cl.
| | |
|---|---|
| *H03L 7/06* | (2006.01) |
| *G06F 1/14* | (2006.01) |
| *G06F 1/12* | (2006.01) |
| *G06F 1/06* | (2006.01) |

(52) U.S. Cl.
CPC .................. *H03L 7/06* (2013.01); *G06F 1/06* (2013.01); *G06F 1/12* (2013.01); *G06F 1/14* (2013.01)

(58) Field of Classification Search
None
See application file for complete search history.

(56) References Cited

U.S. PATENT DOCUMENTS

| | | | |
|---|---|---|---|
| 6,768,297 B2* | 7/2004 | Johnson | G01R 31/31937 324/73.1 |
| 7,013,119 B2* | 3/2006 | Yamauchi | G04G 3/02 455/258 |
| 9,490,926 B2* | 11/2016 | Kim | H04J 3/0697 |
| 10,571,147 B1* | 2/2020 | Ludlow | F24F 11/56 |
| 2004/0152438 A1* | 8/2004 | Yamauchi | H04W 56/0035 455/343.1 |

FOREIGN PATENT DOCUMENTS

JP        2006-244264        9/2006

* cited by examiner

*Primary Examiner* — Thomas J. Hiltunen
(74) *Attorney, Agent, or Firm* — Wenderoth, Lind & Ponack, L.L.P.

(57) ABSTRACT

According to a synchronization method, a basic timing signal generation circuit generates a basic timing signal. A communication control circuit generates a first communication cycle timing signal, measures an input difference between the basic timing signal and a predetermined one of first communication cycle timing signals, divides a compensation value responsive to the input difference by the number of first communication cycle timing signals, adds up a value resulting from the division in a communication cycle, compensates for timing of generating the first communication cycle timing signal with timing equal to or greater than a predetermined value, and transmits timing compensation data to external equipment. The external equipment generates a second communication cycle timing signal, compensates for timing of generating the second communication cycle timing signal based on timing of receipt of the timing compensation data, and synchronizes with the first communication cycle timing signal.

6 Claims, 10 Drawing Sheets

SYNCHRONIZATION METHOD AND CONTROLLER

This application is based on and claims the benefit of priority from Japanese Patent Application No. 2019-145463, filed on 7 Aug. 2019, the content of which is incorporated herein by reference.

BACKGROUND OF THE INVENTION

Field of the Invention

The present invention relates to a synchronization method and a controller.

Related Art

A numerical controller makes real-time communication to control the position, speed, etc. of each of a plurality of motors such as a servo motor included in a machine tool or a robot, for example, thereby performing machining into a complicated shape, etc. This requires highly accurate synchronization between a communication cycle timing signal generated in each communication cycle by a communication control circuit included in the numerical controller and a communication cycle timing signal generated by an amplifier of each motor. The communication cycle timing signal from the communication control circuit is also required to be synchronized with a basic timing signal indicating basic unit time of the operation of the numerical controller generated by a basic timing signal generation circuit included in the numerical controller.

In the presence of a numerical controller as a master unit and a numerical controller as a slave unit connected to each other, a basic timing signal from the master unit and a basic timing signal from the slave unit are required to be synchronized with each other.

In this regard, if error is caused between the basic timing signals from the master unit and the slave unit due to communication abnormality between the numerical controller as the master unit and the numerical controller as the slave unit, for example, such error is corrected and synchronization is made between the signals by a known technique. See patent document 1, for example.

Patent Document 1: Japanese Unexamined Patent Application, Publication No. 2006-244264

SUMMARY OF THE INVENTION

In the numerical controller, the basic timing signal generated by the basic timing signal generation circuit and the communication cycle timing signal generated by the communication control circuit may be based on different clocks in some cases. In such cases, for making real-time communication, the communication control circuit needs to follow the communication cycle timing signal from the communication control circuit to the basic timing signal. If the communication control circuit is to make communication 256 times in an interval of 4 ms of the basic timing signal, for example, an interval of the communication cycle timing signal (one communication cycle) is determined to be 15.625 us. As the basic timing signal and the communication cycle timing signal are based on different clocks, however, error may be caused between these signals due to the foregoing accuracy error between the clocks.

FIG. 9 shows an example of a controller 1.

As shown in FIG. 9, the controller 1 includes a basic timing signal generation circuit 2 and a communication control circuit 3. The communication control circuit 3 of the controller 1 is connected to n amplifiers 10(1) to 10(n) (n is an integer of equal to or greater than 1). The controller 1 is a numerical controller publicly known to a person skilled in the art and controls the operation of a machine tool not shown. If the machine tool not shown is a robot, the controller 1 may include a robot controller, for example.

The amplifiers 10(1) to 10(n) may be included in a machine tool or a robot not shown, for example, to be controlled by the controller 1. In the following description, where the amplifiers 10(1) to 10(n) are not required to be distinguished from each other, these amplifiers may also be called an "amplifier 10" collectively.

The basic timing signal generation circuit 2 generates a basic timing signal indicating basic unit time of the operation of the controller 1.

As shown in FIG. 10A, the communication control circuit 3 generates a communication cycle timing signal (hereinafter also called a "timing signal EXSYN") in each communication cycle (15.625 us). Further, in response to the timing signal EXSYN generated in each communication cycle, the communication control circuit 3 transmits packet PK in each communication cycle containing timing compensation data stored in a header portion together with control data about a motor for each amplifier 10.

As shown in FIG. 10B, for example, the amplifier 10(1) measures time T in advance from a communication cycle timing signal generated in each communication cycle by the amplifier 10(1) (hereinafter also called a "timing signal EXSYN1") until receipt of the timing compensation data in the packet PK. On the basis of a clock (not shown) included in the amplifier 10(1), the amplifier 10(1) compares timing of the time T measured in advance until the receipt of the timing compensation data and timing of actual receipt of the timing compensation data in the packet PK. On the basis of a result of the comparison, the amplifiers 10(1) judges whether to shift a next timing signal EXSYN1, thereby allowing compensation for error between the controller 1 and the amplifier 10(1).

The amplifiers 10(2) to 10(n) performs synchronization in the same way as the synchronization by the amplifier 10(1).

Highly accurate synchronization is required between the communication control circuit 3 of the controller 1 and each amplifier 10. Further, the communication control circuit 3 is required to make synchronization between the basic timing signal generated by the basic timing signal generation circuit 2 and the timing signal EXSYN. If the basic timing signal generation circuit 2 and the communication control circuit 3 operate on the basis of different clocks, however, a synchronous circuit is required for making synchronization between the basic timing signal generation circuit 2 and the communication control circuit 3.

While compensation is made for synchronization between the basic timing signal generation circuit 2 and the communication control circuit 3, compensation of error between the controller 1 and the amplifier 10(1) is practically prohibited to cause a problem of reduction in synchronization accuracy.

(1) An aspect of a synchronization method of this disclosure is a synchronization method of synchronizing real-time communication between a controller and at least one external equipment. The controller includes a basic timing signal generation circuit and a communication control circuit operating on the basis of clocks differing from each other. The method includes: a basic timing signal generation step that the basic timing signal generation circuit generates a basic timing signal indicating basic unit time of the operation of the controller; a first communication cycle timing signal generation step that the communication control circuit generates a first communication cycle timing signal indicating a communication cycle of communication with the external equipment; an input difference step that the communication control circuit measures an input difference of a predetermined one of the first communication cycle timing signals from the basic timing signal; a compensation timing averaging step that the communication control circuit divides a compensation value responsive to the input difference measured in the input difference step by the number of the first communication cycle timing signals generated in an interval of the basic timing signal, and adds up a value resulting from the division in each of the communication cycles, thereby compensating for timing of generation of the first communication cycle timing signal with timing of a value resulting from the adding up being equal to or greater than a predetermined value; a transmission step that the communication control circuit transmits packet containing timing compensation data indicating compensation of timing of generation of the first communication cycle timing signal to the external equipment in each of the communication cycles; a second communication cycle timing signal generation step that the external equipment generates a second communication cycle timing signal indicating a communication cycle of communication with the controller; and a synchronization step that the external equipment compensates for generation of the second communication cycle timing signal on the basis of timing of receipt of the timing compensation data in the packet, and synchronizes with the first communication cycle timing signal.

(2) An aspect of a controller of this disclosure is a controller including a basic timing signal generation circuit and a communication control circuit operating on the basis of clocks differing from each other, and making real-time communication with at least one external equipment. The basic timing signal generation circuit generates a basic timing signal indicating basic unit time of the operation of the controller. The communication control circuit includes: a communication cycle timing signal generation circuit that generates a communication cycle timing signal indicating a cycle of communication with the external equipment; an input difference counter that measures an input difference of a predetermined one of the communication cycle timing signals from the basic timing signal; and a compensation timing averaging circuit that divides a compensation value responsive to the input difference measured by the input difference counter by the number of the communication cycle timing signals generated in an interval of the basic timing signal, and adds up a value resulting from the division in each of the communication cycles, thereby compensating for timing of generation of the communication cycle timing signal by the communication cycle timing signal generation circuit with timing of a value resulting from the adding up being equal to or greater than a predetermined value. The communication control circuit transmits packet containing timing compensation data indicating compensation of timing of generation of the communication cycle timing signal to the external equipment in each of the communication cycles.

According to the aspect, even if the basic timing signal generation circuit and the communication control circuit operate on the basis of different clocks, the accuracy of synchronization between the communication control circuit and the external equipment can still be maintained.

DETAILED DESCRIPTION OF THE INVENTION

Before description of a first embodiment, a basic configuration of a synchronous circuit will be described first that is to make synchronization between a basic timing signal generation circuit 2 and a communication control circuit 3 if the basic timing signal generation circuit 2 and the communication control circuit 3 are based on different clocks.

Figure 9:
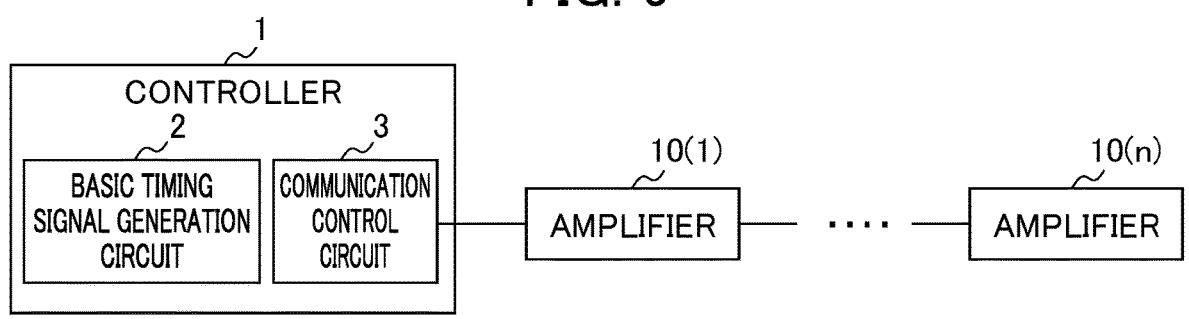
FIG. 9 shows an example of a controller.
Figure 10A:
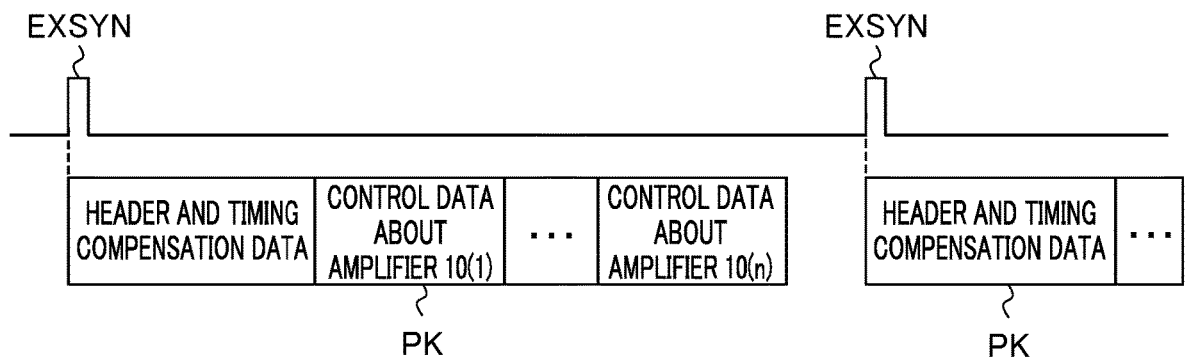
FIG. 10A shows an example of a communication cycle timing signal generated by a communication control circuit and an example of packet.
Figure 10B:
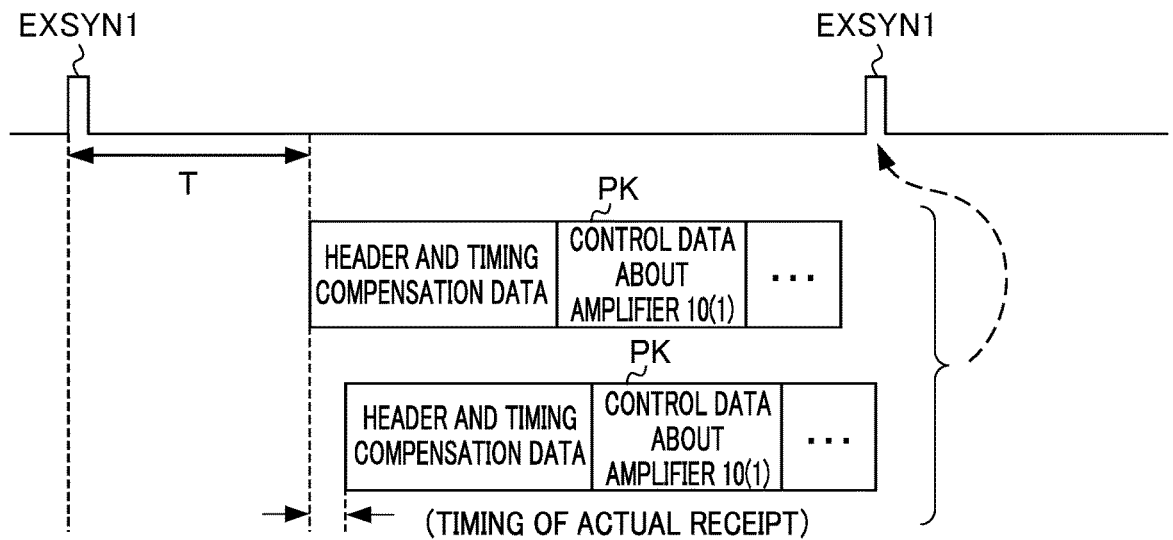
FIG. 10B shows an example of synchronization performed by an amplifier.

In the following, unless otherwise specified, an element having a comparable function to that of an element shown in FIG. 9 will be given the same sign and will not be described in detail.

Figure 1:
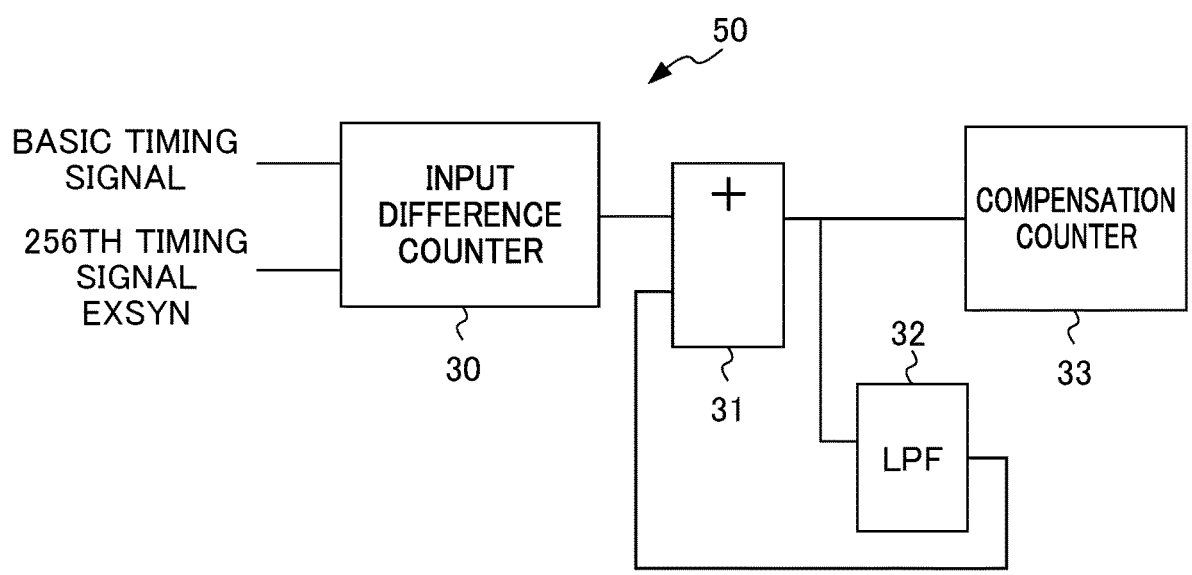
FIG. 1 shows an example of an outline of a synchronous circuit for synchronizing a basic timing signal generation circuit and a communication control circuit with each other.

FIG. 1 shows an example of an outline of a synchronous circuit 50 for making synchronization between the basic timing signal generation circuit 2 and the communication control circuit 3. The synchronous circuit 50 is included in the communication control circuit 3.

In the following description, a basic timing signal is generated at intervals of 4 ms, for example. A timing signal EXSYN from the communication control circuit 3 is generated at intervals of 15.625 us in order to make communication 256 times in the interval of 4 ms between the basic timing signals. The basic timing signal may be generated at time intervals other than 4 ms, for example. The timing signal EXSYN may be generated at time intervals other than 15.625 us.

The synchronous circuit 50 shown in FIG. 1 includes an input difference counter 30, an adder 31, a low-pass filter (LPF) 32, and a compensation counter 33.

Figure 2:
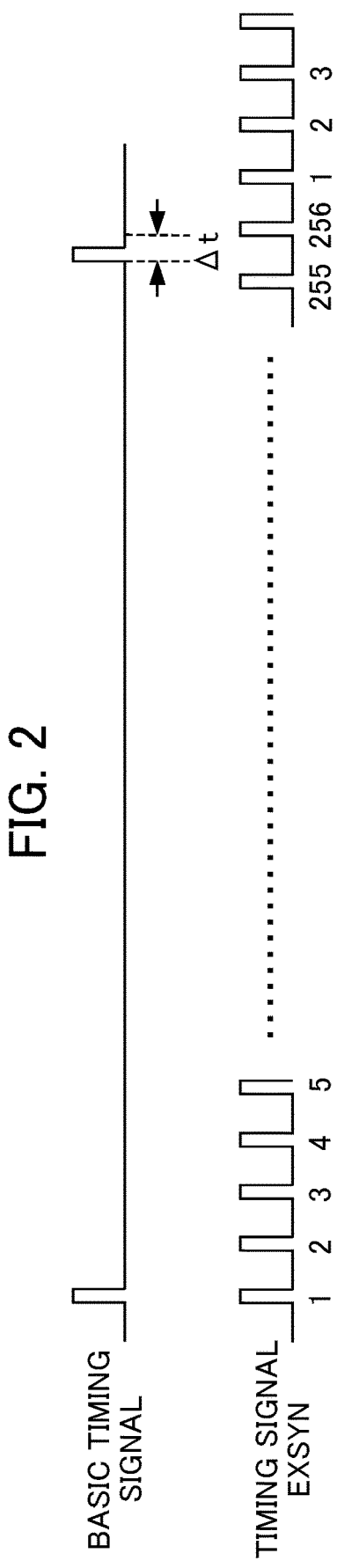
FIG. 2 shows an example of a relationship between a basic timing signal and a communication cycle timing signal.

As shown in FIG. 2, the input difference counter 30 measures an input difference between the basic timing signal and a 256th timing signal EXSYN on the basis of a clock not shown, and counts the input difference as the number of clocks.

The adder 31 outputs a value, determined by adding the number of clocks Δt from the input difference counter 30 and a feedback value from the LPF 32, to the compensation counter 33.

The compensation counter 33 shifts the timing signals EXSYN of a number indicated by the value received from the adder 31 forward by one clock or backward by one clock to follow the basic timing signal.

The following shows the reason why the adder 31 adds the feedback value given from the LPF 32 to the number of clocks Δt given from the input difference counter 30. As described above, the communication control circuit 3 shifts each of the timing signals EXSYN of the same number as the counted number of clocks forward by one clock or backward by one clock to follow the basic timing signal. If only the number of clocks Δt is given from the input difference counter 30, error between the basic timing signal and the $256^{th}$ timing signal EXSYN continues eternally. In response to this, the adder 31 adds the feedback value given from the LPF 32 to the number of clocks Δt given from the input difference counter 30 to achieve coincidence between the basic timing signal and the 256th timing signal EXSYN.

FIG. 2 shows an example of a process of synchronizing the basic timing signal and the timing signal EXSYN with each other by the synchronization shown in FIG. 1.

As shown in FIG. 2, on the basis of a clock (not shown) included in the communication control circuit 3, the input difference counter 30 counts an input difference between the basic timing signal given from the basic timing signal generation circuit 2 and the $256^{th}$ timing signal EXSYN as the number of clocks Δt. If a value resulting from the addition given from the adder 31 is −3 clock, the compensation counter 33 shifts three consecutive timing signals EXSYN forward by one clock including a first signal, a second signal, and a third signal after the 256th timing signal EXSYN shown in FIG. 2, thereby following with the basic timing signal. By doing so, the communication control circuit 3 can make synchronization with the basic timing signal generation circuit 2.

Figure 3:
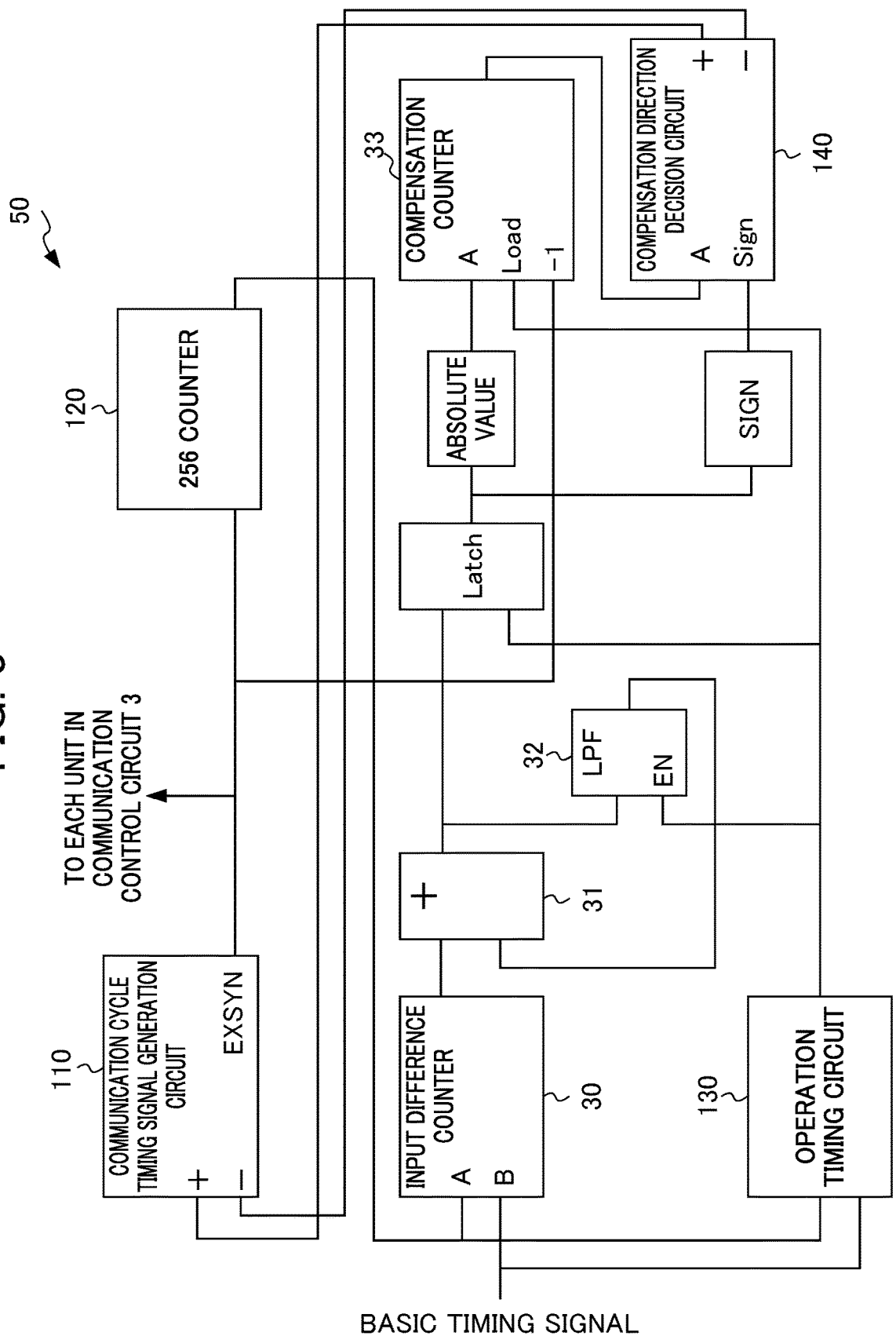
FIG. 3 shows an example of a detailed circuit diagram of the synchronous circuit in FIG. 1.

FIG. 3 shows an example of a detailed circuit diagram of the synchronous circuit 50 in FIG. 1.

The synchronous circuit 50 shown in FIG. 3 includes a communication cycle timing signal generation circuit 110, a 256 counter 120, an operation timing circuit 130, and a compensation direction decision circuit 140 in addition to the input difference counter 30, the adder 31, the LPF 32, and the compensation counter 33, for example.

Publicly-known elements are applicable to elements including Latch, an absolute value, and a sign, so that these elements will not be described in detail.

In the absence of input of a signal "1" to a terminal "+" and a terminal "−" from the compensation direction decision circuit 140 described later, the communication cycle timing signal generation circuit 110 generates the timing signal EXSYN in each communication cycle (1296 clocks, for example) on the basis of a clock (not shown) included in the communication control circuit 3. In the presence of input of a signal "1" to the terminal "+" from the compensation direction decision circuit 140 described later, the communication cycle timing signal generation circuit 110 generates a timing signal EXSYN defining 1297 clocks as one communication cycle. Namely, the communication cycle timing signal generation circuit 110 generates the timing signal EXSYN with timing shifted backward by one clock. In the presence of input of a signal "1" to the terminal "−" from the compensation direction decision circuit 140 described later, the communication cycle timing signal generation circuit 110 generates the timing signal EXSYN defining 1295 clocks as one communication cycle. Namely, the communication cycle timing signal generation circuit 110 generates the timing signal EXSYN with timing shifted forward by one clock.

While one communication cycle described herein corresponds to 1296 clocks, a different number of clocks may be set for one communication cycle.

The 256 counter 120 counts the number of the timing signals EXSYN generated by the communication cycle timing signal generation circuit 110, and outputs one out of every 256 signals (namely, at intervals of 4 ms) to the input difference counter 30 and the operation timing circuit 130 described later.

As described above, the input difference counter 30 measures an input difference between the basic timing signal and a 256th timing signal EXSYN as a predetermined timing signal EXSYN.

More specifically, on the basis of a clock not shown in the communication control circuit 3, the input difference counter 30 counts an input difference between the basic timing signal and the 256th timing signal EXSYN as the number of clocks. If input to a terminal B (basic timing signal) is made earlier than input to a terminal A (256th timing signal EXSYN), the input difference counter 30 outputs a negative count value to the adder 31. If input to the terminal B (basic timing signal) is made later than input to the terminal A ($256^{th}$ timing signal EXSYN), the input difference counter 30 outputs a positive count value to the adder 31.

In the compensation counter 33, the absolute value of a value, resulting from the addition by the adder 31 between the number of clocks Δt given from the input difference counter 30 and a feedback value given from the LPF 32, is set with timing of input of a signal given from the operation timing circuit 130 described later to a terminal "Load". Each time the timing signal EXSYN from the communication cycle timing signal generation circuit 110 is input to a terminal "−1", the compensation counter 33 subtracts the set value by one. If the set value is equal to or greater than 1, the compensation counter 33 outputs a signal "1" to the compensation direction decision circuit 140 described later with timing of subtraction of the set value by one.

The operation timing circuit 130 outputs a signal to each of the elements including the LPF 32, Latch, and the compensation counter 33 with timing of input of a later one of the 256th timing signal EXSYN and the basic timing signal. This causes the LPF 32, Latch, and the compensation counter 33 to operate with timing of receipt of the signal from the operation timing circuit 130.

If the signal "1" is input from the compensation counter 33 to a terminal A and if a signal "0" is input to a terminal "Sign" (meaning that a count value from the adder 31 is a positive value), the compensation direction decision circuit 140 outputs a signal "1" from a terminal "+". In this case, the communication cycle timing signal generation circuit 110 generates the timing signal EXSYN shifted backward by one clock defining 1297 clocks as one communication cycle. If the signal "1" is input from the compensation counter 33 to the terminal A and if a signal "1" is input to the terminal "Sign" (meaning that a count value from the adder 31 is a negative value), the compensation direction decision circuit 140 outputs a signal "1" from a terminal "−". By doing so, the communication cycle timing signal generation circuit 110 generates the timing signal EXSYN shifted forward by one clock defining 1295 clocks as one communication cycle.

Figure 4:
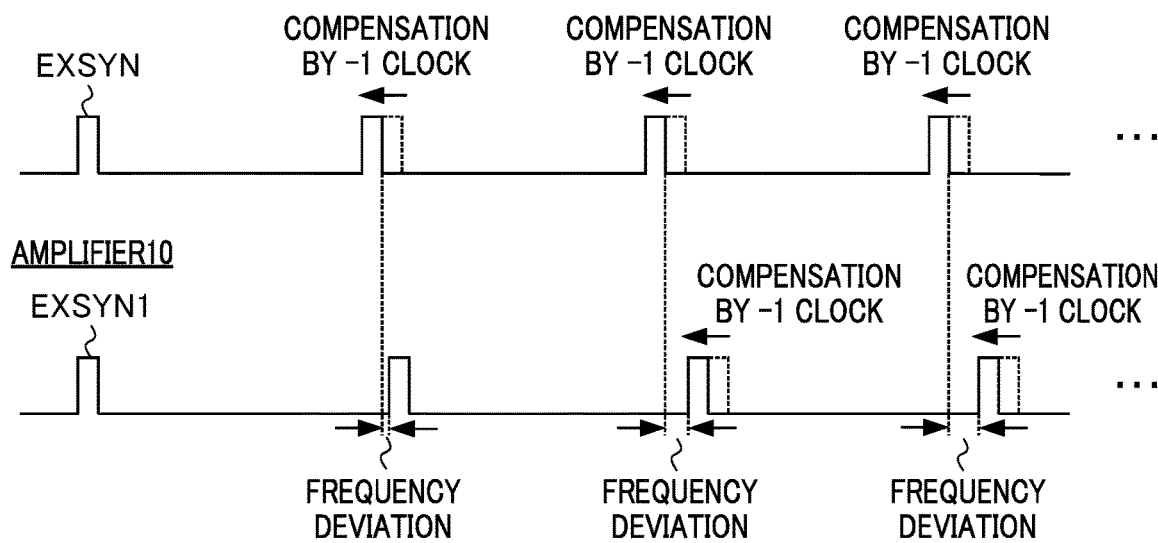
FIG. 4 shows an example describing frequency deviation caused between the communication control circuit and an amplifier.

If a value resulting from addition by the adder 31 in FIG. 3 between the number of clocks Δt given from the input difference counter 30 and a feedback value given from the LPF 32 is "−32" clocks, for example, the communication control circuit 3 generates 32 timing signals EXSYN consecutively from a first timing signal EXSYN each shifted forward by one clock (compensated for by −1 clock) so as to catch up with the basic timing signal, as shown in FIG. 4. In this case, as shown in FIG. 4, the amplifier 10 also generates 32 timing signals EXSYN1 consecutively from a second timing signal EXSYN1 each compensated for by −1 clock so as to make synchronization with the timing signal EXSYN from the communication control circuit 3.

The timing signal EXSYN from the communication control circuit 3 is compensated for toward a direction of the basic timing signal, and the timing signal EXSYN1 from the amplifier 10 is to follow this direction. However, if the timing signal EXSYN from the communication control circuit 3 is compensated for toward the negative direction and if a clock frequency for generation of the timing signal EXSYN1 by the amplifier 10 is lower than a clock frequency for generation of the timing signal EXSYN due to accuracy error as shown in FIG. 4, for example, the timing signal EXSYN and the timing signal EXSYN1 from the amplifier 10 are always compensated for during generation of the 32 timing signals EXSYN each shifted forward by one clock. Thus, compensation between the controller 1 and the amplifier 10 is disabled, and this may cause accumulation of synchronization error due to the frequency deviation.

Likewise, if the timing signal EXSYN from the communication control circuit 3 is compensated for toward a positive direction and if a clock frequency for generation of the timing signal EXSYN1 by the amplifier 10 is higher than a clock frequency for generation of the timing signal EXSYN by the communication control circuit 3 due to accuracy error, accumulation of synchronization error may be caused due to the frequency deviation while the communication control circuit 3 compensates for the timing signal EXSYN toward the positive direction.

As described above, the foregoing synchronous circuit for synchronizing the basic timing signal generation circuit 2 and the communication control circuit 3 with each other has the risk of accumulation of synchronization error due to frequency deviation.

First Embodiment

According to the first embodiment, a synchronous circuit 100 of the communication control circuit 3 includes a compensation timing averaging circuit. If error between a basic timing signal and the 256th timing signal EXSYN is less than 256 clocks, for example, the compensation timing averaging circuit is used for eliminating this error. This allows the timing signal EXSYN to be compensated for on average in the interval of the basic timing signal (4 ms).

An outline of the first embodiment will be described first. According to the first embodiment, the synchronous circuit 100 of the communication control circuit 3 includes the compensation timing averaging circuit that divides a compensation value responsive to an input difference measured by an input difference counter by the number of the timing signals EXSYN generated in the interval of the basic timing signal, adds up a value resulting from the division in each communication cycle, and compensates for timing of generation of the timing signal EXSYN by the communication cycle timing signal generation circuit 110 with timing of a value resulting from the adding up being equal to or greater than a predetermined value. The synchronous circuit 100 generates the timing signal EXSYN thinned out when the value in the compensation timing averaging circuit becomes equal to or more than a predetermined value by shifting it forward by one clock or backward by one clock. The amplifier 10 can compensate for synchronization error due to frequency deviation caused between the timing signal EXSYN from the communication control circuit 3 and the timing signal EXSYN1 from the amplifier 10 with timing of the communication control circuit 3 not compensating for the timing signal EXSYN.

As a result, according to the first embodiment, even if the basic timing signal generation circuit 2 and the communication control circuit 3 operate on the basis of different clocks, the accuracy of synchronization between the communication control circuit 3 and the amplifier 10 can still be maintained.

The configuration of the first embodiment will be described next in detail using drawings.

<Synchronous Circuit 100>

Figure 5:
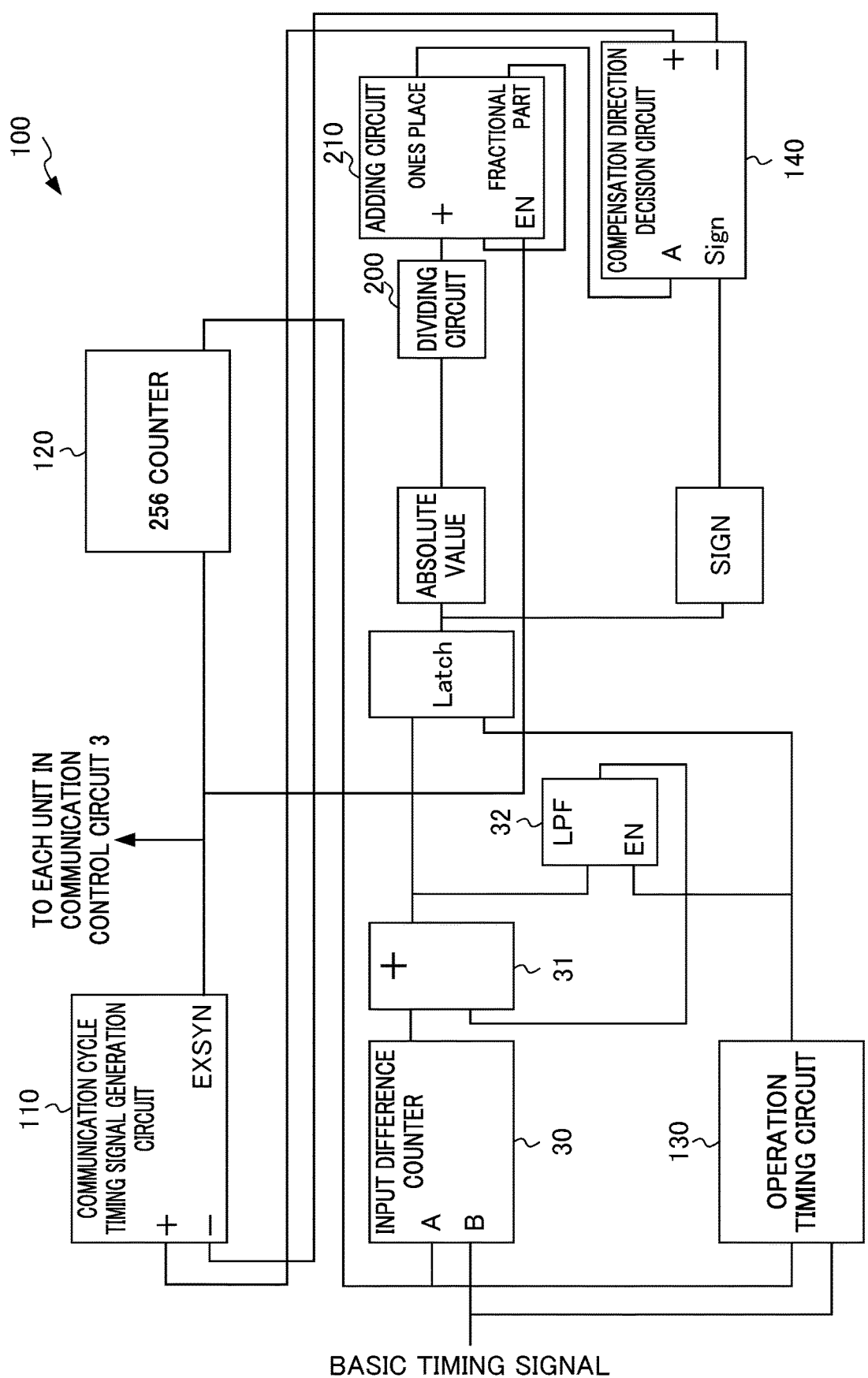
FIG. 5 shows an example of a synchronous circuit included in a communication control circuit of a controller according to a first embodiment.

FIG. 5 shows an example of the synchronous circuit 100 included in the communication control circuit 3 of the controller 1 according to the first embodiment. An element having a comparable function to that of an element of the synchronous circuit 50 in FIG. 3 will be given the same sign and will not be described in detail.

The synchronous circuit 100 shown in FIG. 5 includes the communication cycle timing signal generation circuit 110, the 256 counter 120, the input difference counter 30, the adder 31, the LPF 32, a dividing circuit 200, an adding circuit 210, the operation timing circuit 130, and the compensation direction decision circuit 140, for example. Namely, the synchronous circuit 100 includes the dividing circuit 200 and the adding circuit 210 instead of the compensation counter 33 in FIG. 3. The dividing circuit 200 and the adding circuit 210 work cooperatively to function as the compensation timing averaging circuit.

The dividing circuit 200 divides a compensation value responsive to an input difference measured by the input difference counter 30 by the number of the timing signals EXSYN generated in the interval of the basic timing signal. If a value determined as a compensation value resulting from addition by the adder 31 between the number of clocks Δt given from the input difference counter 30 and a feedback value given from the LPF 32 is "−64" clocks, for example, the dividing circuit 200 divides the value "64" by the value "256". The dividing circuit 200 outputs a value "0.25" resulting from the division to the adding circuit 210.

If the number of the timing signals EXSYN generated in the interval of the basic timing signal is a power of two such as "256", the dividing circuit 200 may be a shift circuit.

The adding circuit 210 adds up a value resulting from the division in each communication cycle to compensate for timing of generation of the timing signal EXSYN by the communication cycle timing signal generation circuit 110 with timing of a value resulting from the adding up being equal to or greater than a predetermined value.

More specifically, each time the timing signal EXSYN is received from the communication cycle timing signal generation circuit 110, the adding circuit 210 adds up the value "0.25" resulting from the division to acquire the following values: "0.25," "0.5", "0.75", and "1.0". If the predetermined value is set in advance at "1", for example, the adding circuit 210 outputs a signal "1" from a terminal "ones place"

to the compensation direction decision circuit 140 with timing of a value resulting from the adding up being equal to or greater than "1.0", and sets the ones place of the value resulting from the adding up at "0". Each time the timing signal EXSYN is thereafter received from the communication cycle timing signal generation circuit 110, the adding circuit 210 adds up the value "0.25" resulting from the division.

Figure 6:
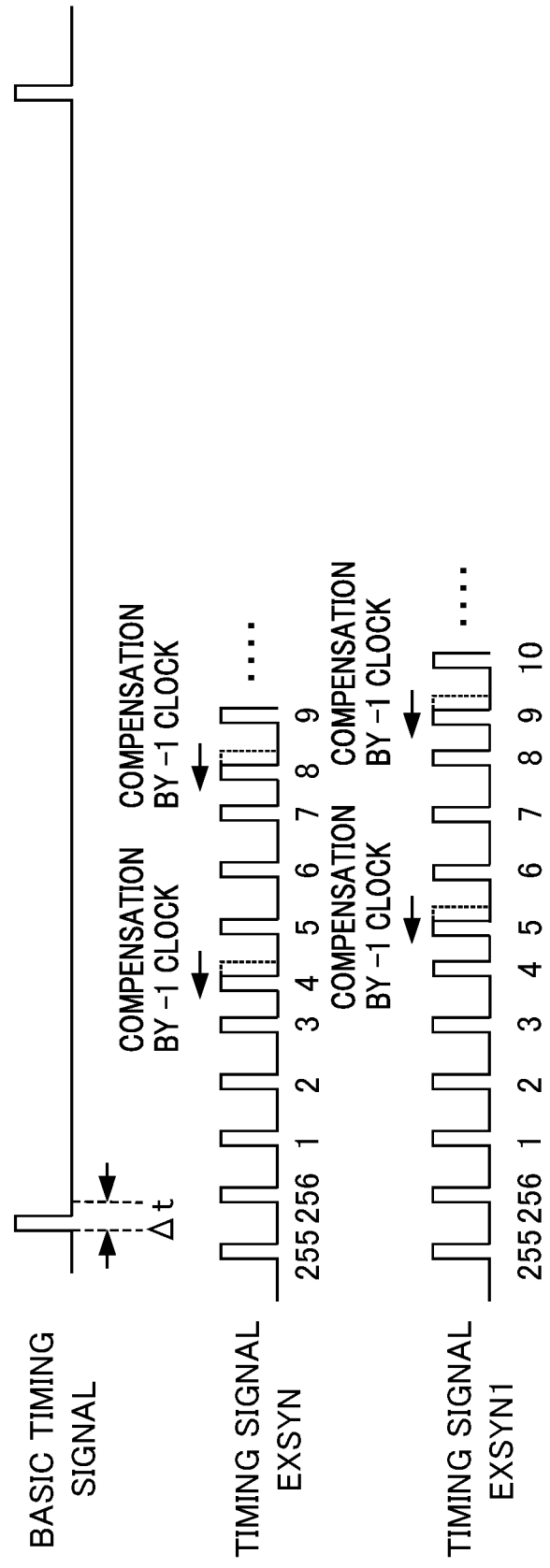
FIG. 6 shows an example of a relationship between a basic timing signal, a communication cycle timing signal from the communication control circuit, and a communication cycle timing signal from an amplifier.

FIG. 6 shows an example of a relationship between the basic timing signal, the timing signal EXSYN from the communication control circuit 3, and the timing signal EXSYN1 from the amplifier 10(1).

As described above, in response to receipt of the four timing signals EXSYN, the adding circuit 210 outputs the signal "1" from the terminal "ones place" to the compensation direction decision circuit 140. By doing so, as shown in FIG. 6, the communication cycle timing signal generation circuit 110 compensates for timing of generation of 64 timing signals EXSYN thinned out from 256 timing signals EXSYN including one out of four timing signals EXSYN such as the fourth timing signal EXSYN and the eighth timing signal EXSYN, thereby achieving synchronization with the basic timing signal.

On the basis of the packet PK received in each communication cycle from the communication control circuit 3, the amplifier 10(1) compensates for timing of generation of 64 thinned out timing signals EXSYN1 including one out of four timing signals EXSYN1 such as the fifth timing signal EXSYN1 and the ninth timing signal EXSYN1, thereby achieving synchronization with the timing signal EXSYN from the communication control circuit 3.

The communication control circuit 3 does not compensate for three out of four timing signals EXSYN. In a period when the communication control circuit 3 does not compensate for the timing signal EXSYN, the amplifier 10(1) can compensate for timing of generation of the timing signal EXSYN1 on the basis of the packet PK received in each communication cycle from the communication control circuit 3. This allows the amplifier 10(1) to reduce accumulation of synchronization error due to frequency deviation, making it possible to maintain the accuracy of synchronization with the controller 1.

As described above, the synchronous circuit 100 of the communication control circuit 3 according to the first embodiment divides a compensation value responsive to an input difference measured by the input difference counter 30 by the number of the timing signals EXSYN generated in the interval of the basic timing signal, and adds up a value resulting from the division in each communication cycle. The synchronous circuit 100 compensates for timing of generation of the timing signal EXSYN by the communication cycle timing signal generation circuit 110 with timing of a value resulting from the adding up being equal to or greater than a predetermined value. As a result, even if the basic timing signal generation circuit 2 and the communication control circuit 3 operate on the basis of different clocks, the synchronous circuit 100 can still synchronize the basic timing signal generation circuit 2 and the communication control circuit 3 with each other.

The amplifier 10 compensates for synchronization error due to frequency deviation caused between the timing signal EXSYN from the communication control circuit 3 and the timing signal EXSYN1 from the amplifier 10 with timing of the communication control circuit 3 not compensating for the timing signal EXSYN. This allows reduction in accumulation of synchronization error due to frequency deviation caused between the timing signal EXSYN from the communication control circuit 3 and the timing signal EXSYN1 from the amplifier 10.

As described above, the synchronous circuit 100 includes the compensation timing averaging circuit. If error between the basic timing signal and the 256th timing signal EXSYN is less than 256 clocks, for example, the compensation timing averaging circuit is used for eliminating this error. This allows the timing signal EXSYN to be compensated for on average in the interval of the basic timing signal (4 ms).

The first embodiment has been described above.

Second Embodiment

In comparison to the foregoing, if a controller 1A makes Ethernet (registered trademark) synchronization of a basic timing signal with a different controller 1B, for example, trying to make the basic timing signal follow a basic timing signal from the different controller 1B may cause significant error of input of the basic timing signal to be input to the communication control circuit 3 from a 256th timing signal EXSYN. In some cases, this may require the synchronous circuit 100 of the communication control circuit 3 to take time in eliminating this error equal to or longer than the interval (4 ms) of the basic timing signal. In this regard, even in the presence of the compensation timing averaging circuit (dividing circuit 200 and adding circuit 210) of the first embodiment, the synchronous circuit 100 is still caused to always follow the basic timing signal, causing accumulation of synchronization error due to accuracy error of clocks between the communication control circuit 3 and the amplifier 10.

According to a second embodiment, in addition to the functions of the first embodiment, a synchronous circuit 100A of the communication control circuit 3 further includes an upper limit setting register 300 that sets an upper limit for a compensation value, and a comparison circuit 310 that compares the compensation value and the upper limit, outputs the compensation value to the compensation timing averaging circuit if the compensation value is equal to or less than the upper limit, and outputs the upper limit as the compensation value to the compensation timing averaging circuit if the compensation value is greater than the upper limit.

By doing so, even if the basic timing signal is input to the communication control circuit 3 with significant error from the 256th timing signal EXSYN, and even if the basic timing signal generation circuit 2 and the communication control circuit 3 operate on the basis of different clocks, the synchronous circuit 100A can still maintain the accuracy of synchronization between the communication control circuit 3 and the amplifier 10.

The second embodiment will be described below.

Figure 7:
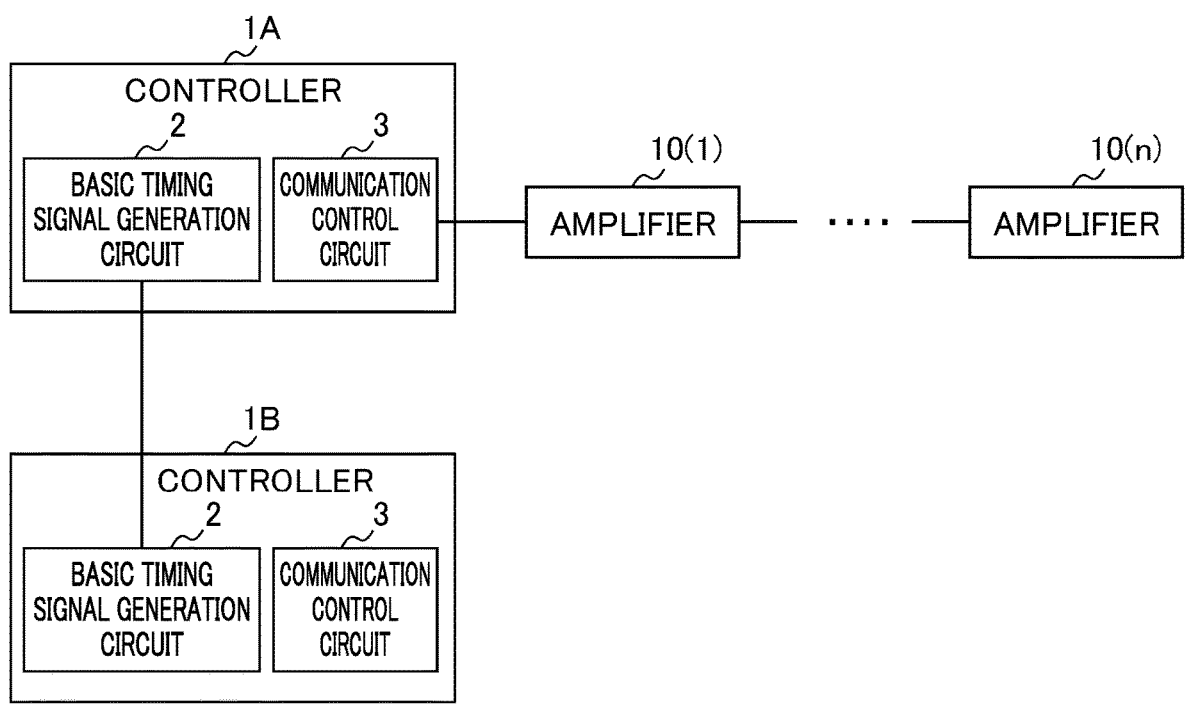
FIG. 7 shows an example of Ethernet synchronization of a basic timing signal made by a controller according to a second embodiment with a different controller.

FIG. 7 shows an example of Ethernet synchronization of the basic timing signal made by the controller 1A according to the second embodiment with the different controller 1B. An element having a comparable function to that of an element of the controller 1 in FIG. 9 will be given the same sign and will not be described in detail.

As shown in FIG. 7, the basic timing signal generation circuit 2 of the controller 1A and the basic timing signal generation circuit 2 of the controller 1B are connected to each other and make Ethernet synchronization of basic timing signals with each other. In this case, in the controller 1A, trying to make the basic timing signal follow the basic timing signal from the controller 1B may cause significant error of input of the basic timing signal to be input to the communication control circuit 3 from the 256th timing signal EXSYN. This may require the communication control circuit 3 of the controller 1A to take time in eliminating this error equal to or longer than the interval (4 ms, for example) of the basic timing signal.

In this case, even in the presence of the compensation timing averaging circuit in FIG. 5, the communication control circuit 3 of the controller 1A is still caused to always follow the basic timing signal. Further, synchronization error is accumulated due to accuracy error of clocks (not shown) between the communication control circuit 3 and the amplifier 10.

<Synchronous Circuit 100A>

Figure 8:
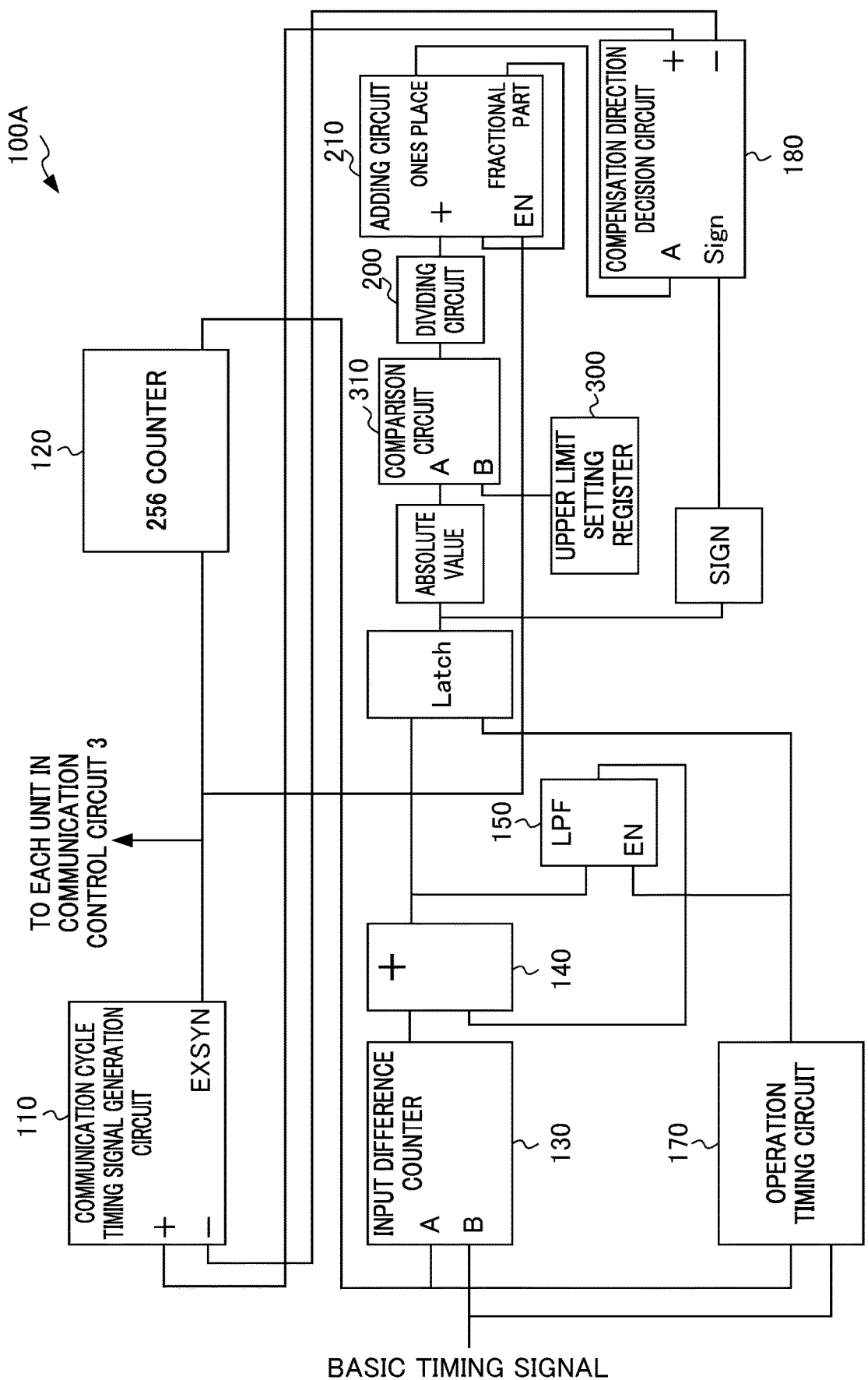
FIG. 8 shows an example of a synchronous circuit included in a communication control circuit of the controller according to the second embodiment.

FIG. 8 shows an example of the synchronous circuit 100A included in the communication control circuit 3 of the controller 1A according to the second embodiment. An element having a comparable function to that of an element of the synchronous circuit 100 in FIG. 5 will be given the same sign and will not be described in detail.

As shown in FIG. 8, the synchronous circuit 100A includes the communication cycle timing signal generation circuit 110, the 256 counter 120, the input difference counter 30, the adder 31, the LPF 32, the dividing circuit 200, the adding circuit 210, the operation timing circuit 130, the compensation direction decision circuit 140, the upper limit setting register 300, and the comparison circuit 310. The upper limit setting register 300 and the comparison circuit 310 work cooperatively to function as an upper limit setting circuit.

The upper limit setting register 300 sets an upper limit for a compensation value that is a value resulting from addition by the adder 31 between the number of clocks Δt given from the input difference counter 30 and a feedback value given from the LPF 32.

For example, the upper limit setting register 300 may set "128" as an upper limit.

As long as the upper limit is smaller than the number of the timing signals EXSYN generated in the interval of the basic timing signal, the upper limit may be a value other than "128".

The comparison circuit 310 compares the compensation value and the upper limit, outputs the compensation value to the compensation timing averaging circuit if the compensation value is equal to or less than the upper limit, and outputs the upper limit as the compensation value to the compensation timing averaging circuit if the compensation value is greater than the upper limit.

For example, the comparison circuit 310 compares a compensation value input to a terminal A that is a value resulting from addition by the adder 31 between the number of clocks Δt given from the input difference counter 30 and a feedback value given from the LPF 32 and the upper limit "128" input from the upper limit setting register 300 to a terminal B. If the compensation value that is a value resulting from addition by the adder 31 between the number of clocks Δt given from the input difference counter 30 and the feedback value given from the LPF 32 is "−64" clocks, the comparison circuit 310 outputs a value "64" to the dividing circuit 200.

If the compensation value that is a value resulting from addition by the adder 31 between the number of clocks Δt given from the input difference counter 30 and the feedback value given from the LPF 32 is "−300" clocks, the comparison circuit 310 outputs the upper limit value "128" to the dividing circuit 200. In this case, a value resulting from division by the dividing circuit 200 is "0.5" (=128/256). This allows the communication cycle timing signal generation circuit 110 to compensate for timing of generation of timing signals EXSYN once in two.

In this case, the communication control circuit 3 does not compensate for timing signals EXSYN once out of two timing signals EXSYN. In a period when the communication control circuit 3 does not compensate for the timing signal EXSYN, the amplifier 10(1) can compensate for timing of generation of the timing signal EXSYN1 on the basis of the packet PK received in each communication cycle from the communication control circuit 3. This allows the amplifier 10(1) to reduce accumulation of synchronization error due to frequency deviation, making it possible to maintain the accuracy of synchronization with the controller 1A.

As described above, if Ethernet synchronization of the basic timing signal is made with the different controller 1B, for example, the synchronous circuit 100A of the communication control circuit 3 according to the second embodiment compares a compensation value responsive to an input difference measured by the input difference counter 30 and an upper limit set at the upper limit setting register 300. If the compensation value is equal to or less than the upper limit, the synchronous circuit 100A outputs the compensation value to the dividing circuit 200. If the compensation value is greater than the upper limit, the synchronous circuit 100A outputs the upper limit as the compensation value to the dividing circuit 200.

By doing so, even if the basic timing signal is input to the communication control circuit 3 with significant error from the $256^{th}$ timing signal EXSYN, and even if the basic timing signal generation circuit 2 and the communication control circuit 3 operate on the basis of different clocks, the synchronous circuit 100A can still synchronize the basic timing signal generation circuit 2 and the communication control circuit 3 with each other.

The amplifier 10 compensates for synchronization error due to frequency deviation caused between the timing signal EXSYN from the communication control circuit 3 and the timing signal EXSYN1 from the amplifier 10 with timing of the communication control circuit 3 not compensating for the timing signal EXSYN. This allows reduction in accumulation of synchronization error due to frequency deviation caused between the timing signal EXSYN from the communication control circuit 3 and the timing signal EXSYN1 from the amplifier 10.

The second embodiment has been described above.

While the first embodiment and the second embodiment have been described above, the controllers 1 and 1A are not limited to the foregoing embodiments but modifications, improvements, etc. are also included in a range in which the purpose is attainable.

<First Modification>

In the first embodiment and the second embodiment described above, the basic timing signal is generated at intervals of 4 ms, and 256 timing signals EXSYN are generated at intervals of 15.625 us in the interval of 4 ms of the basic timing signal. However, these are not the only intervals. For example, the basic timing signal may be generated at time intervals other than 4 ms. The number of the timing signals EXSYN to be generated in the interval of the basic timing signal may be other than 256.

If the number of the timing signals EXSYN generated in the interval of the basic timing signal is a power of two such as "128" and "512", the dividing circuit 200 may be a shift circuit.

<Second Modification>

As an example, in the second embodiment described above, the controller 1A makes Ethernet synchronization of the basic timing signal with the different controller 1B. The controller 1A may make synchronization of the basic timing signal with the different controller 1B other than Ethernet synchronization.

The controller 1A may make synchronization of the basic timing signal with a plurality of different controllers 1B by means of Ethernet synchronization, for example.

The functions of the controller 1 and those of the controller 1A according to the first embodiment and the second embodiment can be realized by hardware, software, or a combination of hardware and software. Being realized by software means being realized by reading and execution of a program by a computer.

Each structure unit in each of the controllers 1 and 1A can be realized by hardware including an electronic circuit, etc., software, or a combination of hardware and software. To realize each structure unit by software, programs configuring the software are installed on a computer. These programs may be stored in a removable medium and then distributed to a user. Alternatively, these programs may be distributed by being downloaded to a computer of the user through a network. If hardware is used for the configuration, some or all of the foregoing functions of the structure units in the foregoing devices can be configured using an integrated circuit (IC) such as an application specific integrated circuit (ASIC), a gate array, a field programmable gate array (FPGA), and a complex programmable logic device (CPLD), for example.

The programs can be stored using various types of non-transitory computer-readable media and can be supplied to a computer. The non-transitory computer-readable media include various types of tangible storage media. Examples of the non-transitory computer-readable media include a magnetic storage medium (a flexible disk, a magnetic tape, or a hard disk drive, for example), a magneto-optical storage medium (a magneto-optical disk, for example), a CD read-only memory (CD-ROM), a CD-R, a CD-R/W, and a semiconductor memory (a mask ROM, a programmable ROM (PROM), an erasable PROM (EPROM), a flash ROM, or a RAM, for example). The programs can also be supplied to the computer using various types of transitory computer-readable media. Examples of the transitory computer-readable media include electrical signals, optical signals, and electromagnetic waves. The transitory computer-readable media can be used for supplying the programs to the computer via wired communication paths such as electric wires and optical fibers, or wireless communication paths.

Steps describing the programs stored in a storage medium certainly include processes to be performed in chronological order according to the order of the steps, and further include processes not to necessarily be performed in chronological order but to be performed in parallel or individually.

As another way of stating the foregoing, the synchronization method and the controller of this disclosure can be embodied in a wide variety of ways having the configurations as follows:

(1) The synchronization method of this disclosure is a method of synchronizing real-time communication between the controller 1 and at least one external equipment (amplifier 10). The controller 1 includes the basic timing signal generation circuit 2 and the communication control circuit 3 operating on the basis of clocks differing from each other. The method includes: a basic timing signal generation step that the basic timing signal generation circuit 2 generates a basic timing signal indicating basic unit time of the operation of the controller; a first communication cycle timing signal generation step that the communication control circuit 3 generates a first communication cycle timing signal indicating a cycle of communication with the external equipment; an input difference step that the communication control circuit 3 measures an input difference of a predetermined one of the first communication cycle timing signals from the basic timing signal; a compensation timing averaging step that the communication control circuit 3 divides a compensation value responsive to the input difference measured in the input difference step by the number of the first communication cycle timing signals generated in an interval of the basic timing signal, and adds up a value resulting from the division in each of the communication cycles, thereby compensating for timing of generation of the first communication cycle timing signal with timing of a value resulting from the adding up being equal to or greater than a predetermined value; a transmission step that the communication control circuit 3 transmits the packet PK containing timing compensation data indicating compensation of timing of generation of the first communication cycle timing signal to the external equipment in each of the communication cycles; a second communication cycle timing signal generation step that the external equipment generates a second communication cycle timing signal indicating a communication cycle of communication with the controller; and a synchronization step that the external equipment compensates for generation of the second communication cycle timing signal on the basis of timing of receipt of the timing compensation data in the packet PK, and synchronizes with the first communication cycle timing signal.

According to the foregoing synchronization method, even if the basic timing signal generation circuit 2 and the communication control circuit 3 operate on the basis of different clocks, the accuracy of synchronization between the communication control circuit 3 and the amplifier 10(1) can still be maintained.

(2) The synchronization method described in (1) may include: an upper limit setting step of setting an upper limit for the compensation value; and a comparison step of comparing the compensation value and the upper limit, outputting the compensation value if the compensation value is equal to or less than the upper limit, and outputting the upper limit as the compensation value if the compensation value is greater than the upper limit.

As a result, even if the controller makes Ethernet synchronization with a different controller, the accuracy of synchronization between the communication control circuit 3 and the amplifier 10 can still be maintained.

(3) In the synchronization method described in (1) or (2), the number of the first communication cycle timing signals generated in the interval of the basic timing signal may be a power of two.

This allows reduction in operation load required for the division.

(4) The controller 1 of this disclosure is a controller including the basic timing signal generation circuit 2 and the communication control circuit 3 operating on the basis of clocks differing from each other, and making real-time communication with at least one external equipment (amplifier 10). The basic timing signal generation circuit 2 generates a basic timing signal indicating basic unit time of the operation of the controller. The communication control circuit 3 includes: the communication cycle timing signal generation circuit 110 that generates a communication cycle timing signal indicating a cycle of communication with the external equipment; the input difference counter 30 that measures an input difference of a predetermined one of the communication cycle timing signals from the basic timing signal; and the compensation timing averaging circuit that divides a compensation value responsive to the input difference measured by the input difference counter 30 by the number of the communication cycle timing signals generated in an interval of the basic timing signal, and adds up a value resulting from the division in each of the communication cycles, thereby compensating for timing of generation of the communication cycle timing signal by the communication cycle timing signal generation circuit 110 with timing of a value resulting from the adding up being equal to or greater than a predetermined value. The communication control circuit 3 transmits the packet PK containing timing compensation data indicating compensation of timing of generation of the communication cycle timing signal to the external equipment in each of the communication cycles.

The controller described above achieves effect comparable to that described in (1).

(5) The controller 1 described in (4) may include: the upper limit setting register 300 that sets an upper limit for the compensation value; and the comparison circuit 310 that compares the compensation value and the upper limit, outputs the compensation value to the compensation timing averaging circuit if the compensation value is equal to or less than the upper limit, and outputs the upper limit as the compensation value to the compensation timing averaging circuit if the compensation value is greater than the upper limit.

This achieves effect comparable to that described in (2).

(6) In the controller 1 described in (4) or (5), the number of the communication cycle timing signals generated in the interval of the basic timing signal may be a power of two.

This achieves effect comparable to that described in (3).

EXPLANATION OF REFERENCE NUMERALS 1, 1A Controller
2 Basic timing signal generation circuit
3 Communication control circuit
10(1) to 10(n) Amplifier
30 Input difference counter
100, 100A Synchronous circuit
110 Communication cycle timing signal generation circuit
200 Dividing circuit
210 Adding circuit
300 Upper limit setting register
310 Comparison circuit

What is claimed is:

1. A synchronization method of synchronizing real-time communication between a controller and at least one external equipment, the controller including a basic timing signal generation circuit and a communication control circuit operating on the basis of clocks differing from each other, the method comprising:
a basic timing signal generation step that the basic timing signal generation circuit generates a basic timing signal indicating basic unit time of the operation of the controller;
a first communication cycle timing signal generation step that the communication control circuit generates a first communication cycle timing signal indicating a cycle of communication with the external equipment;
an input difference step that the communication control circuit measures an input difference of a predetermined one of the first communication cycle timing signals from the basic timing signal;
a compensation timing averaging step that the communication control circuit divides a compensation value responsive to the input difference measured in the input difference step by the number of the first communication cycle timing signals generated in an interval of the basic timing signal, and adds up a value resulting from the division in each of the communication cycles, thereby compensating for timing of generation of the first communication cycle timing signal with timing of a value resulting from the adding up being equal to or greater than a predetermined value;
a transmission step that the communication control circuit transmits packet containing timing compensation data indicating compensation of timing of generation of the first communication cycle timing signal to the external equipment in each of the communication cycles;
a second communication cycle timing signal generation step that the external equipment generates a second communication cycle timing signal indicating a cycle of communication with the controller; and
a synchronization step that the external equipment compensates for generation of the second communication cycle timing signal on the basis of timing of receipt of the timing compensation data in the packet, and synchronizes with the first communication cycle timing signal.

2. The synchronization method according to claim 1, comprising: an upper limit setting step of setting an upper limit for the compensation value; and
a comparison step of comparing the compensation value and the upper limit, outputting the compensation value if the compensation value is equal to or less than the upper limit, and outputting the upper limit as the compensation value if the compensation value is greater than the upper limit.

3. The synchronization method according to claim 1, wherein the number of the first communication cycle timing signals generated in the interval of the basic timing signal is a power of two.

4. A controller including a basic timing signal generation circuit and a communication control circuit operating on the basis of clocks differing from each other, and making real-time communication with at least one external equipment,
the basic timing signal generation circuit generating a basic timing signal indicating basic unit time of the operation of the controller,
the communication control circuit comprising:
a communication cycle timing signal generation circuit that generates a communication cycle timing signal indicating a cycle of communication with the external equipment;
an input difference counter that measures an input difference of a predetermined one of the communication cycle timing signals from the basic timing signal; and
a compensation timing averaging circuit that divides a compensation value responsive to the input difference measured by the input difference counter by the number of the communication cycle timing signals generated in an interval of the basic timing signal, and adds up a value resulting from the division in each of the communication cycles, thereby compensating for timing of generation of the communication cycle timing signal by the communication cycle timing signal generation circuit with timing of a value resulting from the adding up being equal to or greater than a predetermined value, the communication control circuit transmits packet containing timing compensation data indicating compensation of timing of generation of the communication cycle timing signal to the external equipment in each of the communication cycles.

5. The controller according to claim 4, comprising: an upper limit setting register that sets an upper limit for the compensation value; and a comparison circuit that compares the compensation value and the upper limit, outputs the compensation value to the compensation timing averaging circuit if the compensation value is equal to or less than the upper limit, and outputs the upper limit as the compensation value to the compensation timing averaging circuit if the compensation value is greater than the upper limit.

6. The controller according to claim 4, wherein the number of the first communication cycle timing signals generated in the interval of the basic timing signal is a power of two.

* * * * *